United States Patent
Macaluso et al.

(10) Patent No.: US 6,968,288 B2
(45) Date of Patent: Nov. 22, 2005

(54) METHOD FOR DETECTION OF PHOTOLITHOGRAPHIC DEFOCUS

(75) Inventors: Dennis L. Macaluso, South Burlington, VT (US); Richard A. Phelps, Colchester, VT (US); Charles A. Whiting, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 10/604,610

(22) Filed: Aug. 4, 2003

(65) Prior Publication Data

US 2005/0033550 A1 Feb. 10, 2005

(51) Int. Cl.$^7$ .......................... G01N 21/00; G06F 15/00; G06F 19/00; G03B 27/42
(52) U.S. Cl. .......................... 702/155; 355/53; 700/121; 702/166; 702/179
(58) Field of Search .......................... 702/81, 155, 166, 702/179; 700/121; 355/53, 55, 72; 356/237.1, 237.2, 508, 600; 438/14, 16

(56) References Cited

U.S. PATENT DOCUMENTS

| | | | |
|---|---|---|---|
| 5,202,748 A | 4/1993 | MacDonald et al. | 356/508 |
| 5,563,684 A | 10/1996 | Stagaman | 355/72 |
| 5,673,208 A | 9/1997 | Meier et al. | 702/179 |
| 5,884,242 A | 3/1999 | Meier et al. | 702/179 |
| 5,991,004 A | 11/1999 | Wallace et al. | 355/53 |
| 6,198,982 B1 | 3/2001 | Park et al. | 700/121 |
| 6,335,784 B2 | 1/2002 | Mishima | 355/53 |
| 2001/0012098 A1 | 8/2001 | Mishima | 355/53 |
| 2002/0048006 A1 | 4/2002 | Mishima | 355/53 |
| 2002/0097393 A1 | 7/2002 | Nikoonahad et al. | 356/237.2 |

*Primary Examiner*—Michael Nghiem
*Assistant Examiner*—John Le
(74) *Attorney, Agent, or Firm*—Anthony J. Canale (57) ABSTRACT

The present invention relates to determining the location of a defect source which results in a localized elevation on the surface topography of a substrate such as, for example, a silicon wafer. The wafer is placed on a chuck of a semiconductor process tool such as, for example, a photolithographic tool. The upper surface of the wafer is processed by the photolithographic tool to obtain topography measurements. The topography measurements are analyzed to detect the presence of the localized elevation on the upper surface of the wafer. Once the presence of the localized elevation is detected, calculations are performed using the topography measurements to determine whether the source of the localized elevation results from the chuck.

30 Claims, 4 Drawing Sheets

METHOD FOR DETECTION OF PHOTOLITHOGRAPHIC DEFOCUS

BACKGROUND OF INVENTION

1. Field of the Invention

The field of the invention is semiconductor processing. More specifically, the invention relates to determining the location of a defect source which results in a localized elevation on the surface topography of a semiconductor substrate.

2. Background of the Invention

As the physical dimensions of semiconductor devices continue to decrease, the topography of the semiconductor substrate upon which the integrated circuit devices are formed becomes an important factor. A semiconductor processing step such as, for example, photolithography is used to pattern images in a photoresist on the surface of the substrate. The quality of the images formed on the surface of the substrate by photolithography is related to the topography of the substrate since the topography of the substrate can affect the focus of the photolithographic tool. Localized areas of relatively high elevation can result in defocusing of the patterned images in those areas, commonly referred to as "hotspots". Hotspots are typically caused by a defect source such as, for example, foreign particulate matter trapped between the substrate and the photolithography aligner chuck upon which the substrate is placed. The foreign particulate matter causes the substrate to bend or deflect resulting in an elevation of a portion of the surface of the substrate above the foreign material. When the elevation deviation is large enough, the imaging surface will be out of focus relative to surrounding images, and imaging failure occurs resulting, typically, in a semiconductor device that will not function.

In order to detect hotspots so that corrective actions can be taken to prevent or minimize product yield loss, printed substrates are either visually scanned by a person with the naked eye, or are inspected by automated equipment. Visual scanning by the naked eye often only detects hotspots on those photolithographic patterns which are clearly repetitive such as high density patterns (e.g. nested lines/spaces). It is very difficult to detect hotspots on lithographic patterns with non-repetitive or isolated patterns (e.g. contact levels). In addition, visual scanning increases the risk of handling damage and defects on the substrate due to human contact. Automated scanning may detect imaging failure, but is not able to detect the root cause of the failure. For example, automated scanning may reveal that image quality is poor in a circular region on a given substrate but it does not indicate that this poor image quality is a result of a local defocus failure. Further, automated scanning requires expensive defect detection and analysis equipment.

Even when a hotspot is detected, visual or automated scanning techniques cannot determine whether the foreign particulate matter which caused the hotspot resides on the photolithography aligner chuck or on the substrate itself. Therefore, unnecessary maintenance activity may be performed on the chuck when the particulate matter is actually on the incoming substrates.

Determining whether the defect source which causes a hotspot is related to the substrate or the photolithography aligner chuck is desired.

SUMMARY OF INVENTION

It is thus an object of the present invention to determine whether a defect source which causes a hotspot is related to the substrate or the photolithography aligner chuck.

In a first aspect, the present invention is a method for locating a source of a localized elevation on a substrate, comprising the steps of:

(a) measuring a first surface of a plurality of substrates placed separately on a chuck to obtain topography measurements;

(b) detecting the presence of a localized elevation in a field on the first surface of the substrates; and (c) determining whether the source results from the chuck.

In a second aspect, the present invention is a computer-readable program product for causing a computer to detect and characterize a defect on a surface of a first wafer, comprising:

a first program code means embodied in a computer useable medium for causing the computer to carry out a first set of measurements on a given surface of said first wafer placed on a chuck prior to carrying out an operation on said given surface;

a second program code means embodied in a computer useable medium for causing the computer to carry out a second set of measurements on said given surface of said first wafer while carrying out said operation on said given surface;

a third program code means embodied in a computer useable medium for causing the computer to determine a difference between said first set of measurements and said second set of measurements;

a fourth program code means embodied in a computer useable medium for causing the computer to carry out said first set of measurements, said second set of measurements and said difference measurement on a second wafer placed on the chuck;

a fifth program code means embodied in a computer useable medium for causing the computer to carry out said first set of measurements, said second set of measurements and said difference measurement on a third wafer placed on the chuck; and a sixth program code means embodied in a computer useable medium for causing the computer to compare said measurements from said first wafer, said second wafer, and said third wafer to determine whether a defect results from said chuck.

In a third aspect, the present invention is a program storage device readable by a machine, tangibly embodying a program of instructions executable by a machine to perform a method of locating a source of a localized elevation on a substrate, comprising the steps of:(a) measuring a first surface of a plurality of substrates placed separately on a chuck to obtain topography measurements; (b) detecting the presence of a localized elevation in a field on the first surface of the substrates; and(c) determining whether the source results from the chuck.

BRIEF DESCRIPTION OF DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION

Figure 1:
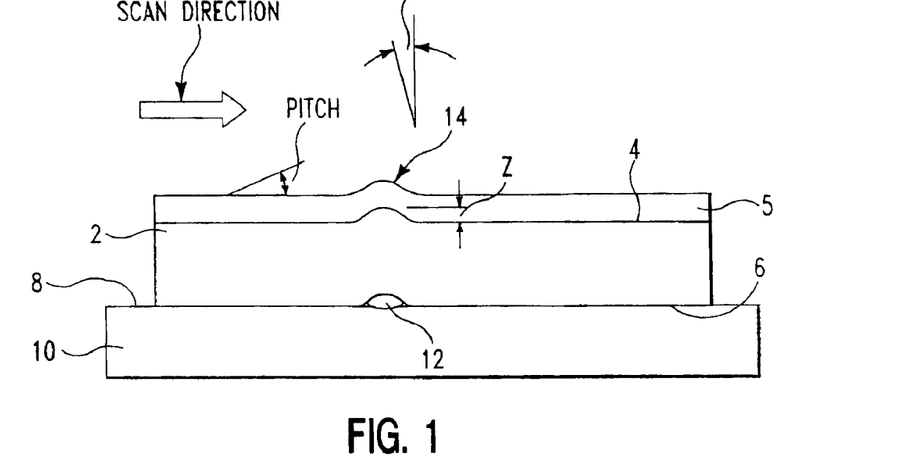
FIG. 1 shows the formation of a localized elevation on an upper surface of a substrate.

The present invention describes a method of analyzing focus parameters generated by a process tool such as, for example, a photolithography tool, to determine whether a defect source which results in a localized elevation on the surface of a substrate resides on the photolithography aligner chuck or on the substrate. As shown in FIG. 1, substrate 2 has an upper surface 4 upon which a pattern is formed in photoresist layer 5, as described in more detail below, and a lower surface 6 which is adjacent upper surface 8 of chuck 10. Defect source 12 (in this case, a foreign particulate) is located between lower surface 6 of substrate 2 and upper surface 8 of chuck 10 and creates localized elevation 14 on upper surface 4 of substrate 2. As will be described below, during a photolithographic process, localized elevation 14 results in what is commonly referred to as a "hotspot".

During processing of substrate 2, a photolithography tool such as, for example, a Nikon 203B available from Nikon Corporation, generates focus parameter data which are related to the topography of upper surface 4 of substrate 2 in order to properly pattern an image in resist layer 5 on surface 4. It should be noted that the present invention is not limited to photolithography tools but is applicable to any tool which generates surface topography data such as thin film measurement tools. Also, it should be noted that substrate 2 can include semiconductor wafers, such as bulk silicon or SiGe wafers, and SOI (Silicon-On-Insulator) wafers. Further, the use of photolithographic processes is not restricted to semiconductor wafers, but should be understood to include applications such as manufacture of flat screen displays, hard disk drive heads and printed circuit boards. In addition, it should be understood that applications encompassed by photolithography include visible wavelength, a multiplicity of mid-UV (g-line through i-line) wavelengths, DUV (248 nm), 193 nm, EUV, X-ray, and electron-beam or ion-beam lithography, in addition to others which are not specifically listed here.

In one embodiment of the present invention, analyzing the focus parameter data provides insight into defect source 12 which causes the imaging failure, permitting the original source of the defect to be eliminated. In another embodiment, analyzing the focus parameter data can differentiate between defect source 12 residing on the chuck 10 or incoming wafers 2 themselves, permitting a proper response to the problem.

Focus parameter data that is generated by the Nikon 203B photolithography tool includes maximum and minimum of the height ("z") of a localized elevation; angle of the focus plane in the direction of the scan ("pitch"); and angle of the focus plane perpendicular to the direction of the scan ("roll"). See FIG. 1. For the Nikon 203B tool, during an imaged field scan (where the "field" is an area along the x,y planes of the wafer on which the image for one or more chips is printed), only a portion of the entire field is exposed through an exposure slit. The typical length of the field in the scan direction is about 20 to about 25 mm and the width of the portion of the field that is exposed is about 8 mm. The Nikon 203B scans continuously across the length of the field until the entire field has been exposed. At a scanning speed of about 175 mm/second (measured at the wafer surface) for the Nikon 203B, the entire field can be exposed in less than 0.5 seconds. When hotspot 14 is encountered during the imaged field scan, the auto-focus system of the photolithography tool utilizes measured z, pitch and roll to match the best focus position/angle of the topography of the portion of the imaged field that is being exposed to the image plane of the lens system. As a practical matter, the focus orientation/position of the portion of the imaged field that is being exposed is adjusted during the scan in order to image a pattern in the portion of the field. In other words, the wafer is moved up and down, tilted forward and/or backward, and/or tilted side to side to maintain focus. The present invention analyzes the best focus parameter data to determine the occurrence of hotspot 14. The analysis of the best focus parameter data can occur in real time, i.e. while wafer 2 is being imaged, or the focus parameter data can be stored and the analysis can occur after wafer 2 has been imaged.

During the exposure scan of a field on upper surface 4 of wafer 2, pre-sensors on the photolithographic tool measure z, pitch and roll of the topography of the portion of the field on the wafer 2 that is ahead of the portion of the field that is being exposed through the exposure slit. The z, pitch and roll measurements from the pre-sensors are utilized by the auto-focus system to move the chuck 10 (which also moves wafer 2) in order to maintain the portion of the imaged field in the image plane during the subsequent exposure step. As the photolithographic tool scans across upper surface 4 to expose the portion of the imaged field, exposure sensors measure the topography of the portion of the field during exposure to provide post-measurement values for z, pitch and roll. For the case where the topography of the imaged field is relatively flat (i.e. no hotspot), the pre- and post-measurement values for corresponding z, pitch and roll will be identical or nearly identical. For the case where hotspot 14 exists in the imaged field, the pre- and post-measurement values for corresponding z, pitch and roll will not be identical resulting in deltas between the pre- and post-measurements. This can be caused by the chuck 10 being physically limited in its movement such that it cannot provide the portion of the imaged field in the image plane due to the size and shape of hotspot 14. Also, the scan speed of the photolithographic tool limits the response time of the chuck 10 to move the portion of the imaged field into the image plane. Thus, deltas in the pre- and post-measurements of z, pitch and roll occur when hotspot 14 is present in an imaged field.

The maximum and minimum values of the moving average of the deltas of z, pitch and roll through the field are reported by the photolithographic tool along with the field coordinates at the end of the exposure. The auto-focusing system of the photolithography tool will not be able to compensate for large changes in topography on upper surface 4 (i.e. z on the order of about tenths of micrometers or more) over a short distance (i.e. less than about 1 mm) resulting in poorly patterned images in this part of the field. As discussed above, the typical length of the field in the scan direction is about 20 to about 25 mm and the speed of the scan in the scan direction is about 175 mm/second for a Nikon 203B tool resulting in less than 0.5 seconds to scan the field. The relatively high scan speed of the photolithographic tool in order to achieve higher wafer throughput results in a decrease in the ability of the auto-focusing system to react quickly enough to large changes in topography on upper surface 4. The delta values will yield information on the existence, size and location of hotspot 14. Further analysis of the delta data can also give information on the character of hotspot 14 so that appropriate corrective action can be taken to eliminate defect source 12 of hotspot 14.

As set forth below, pursuant to the invention, analysis of the data can determine whether the source of the topography discontinuity is a particulate (e.g. particulate 12 shown in FIG. 1), versus a scratch on the lower surface 6 of wafer 2. Moreover, as discussed in more detail below, the invention indicates whether the particulate 12 is attached to the wafer 2 or the chuck 10. One would want to know as soon as possible if defect source 12 is attached to the chuck 10 so that surface 8 can be cleaned and subsequent wafers protected from the occurrence of a similar hotspot. If defect source 12 is attached to the wafer versus attached to the chuck, cleaning of the chuck 10 would be ineffective since defect source 12 is not on chuck 10, resulting in unnecessarily removal of the photolithographic tool from production for cleaning. Knowing that defect source 12 is related to lower surface 6 of wafer 2 would lead to an investigation to determine the root cause of the problem, such as foreign particulate matter (as shown) or some other damage to lower surface 6 (i.e. a scratch). Knowing whether the location of defect source 12 is systematic or random is essential for such an investigation.

Analysis of the focus parameter data according to the present invention will provide information to distinguish between defects on the wafer versus the chuck, and, if it is determined that defect source 12 is related to lower surface 6 of wafer 2, whether defect source 12 is occurring systematically or randomly.

Figure 2:
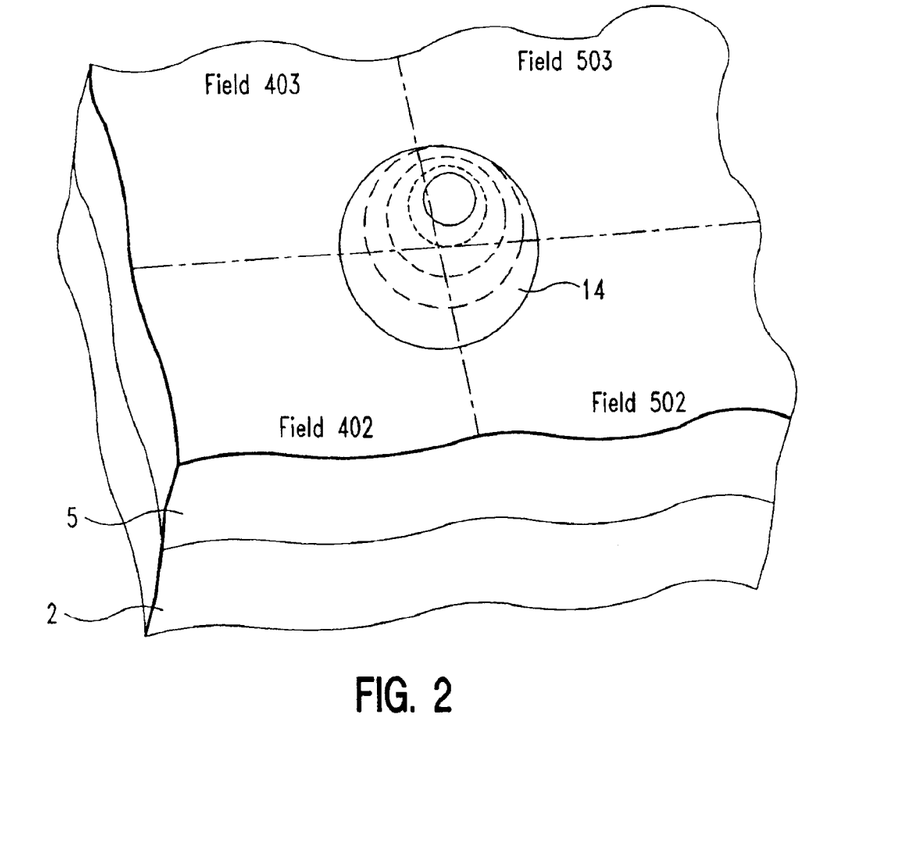
FIG. 2 is a 2-dimensional representation showing the location of the localized elevation with respect to the exposure fields on the upper surface of the substrate.

FIG. 2. shows a 2-dimensional representation of a portion of wafer 2 where hotspot 14 is located. Hotspot 14 encompasses several adjacent fields 402, 403, 502 and 503 (i.e. field 402 represents a field located at column 4 and row 2 of a given wafer). It should be noted that hotspot 14 has a peak height occurring within fields 402 and 502 while the hotspot 14 diminishes in size in fields 403 and 503. Also, although hotspot 14 is shown in FIG. 2 as affecting four fields, the present invention can be used to analyze a hotspot which affects any number of fields such as one, two, three, four or more fields.

Figure 3:
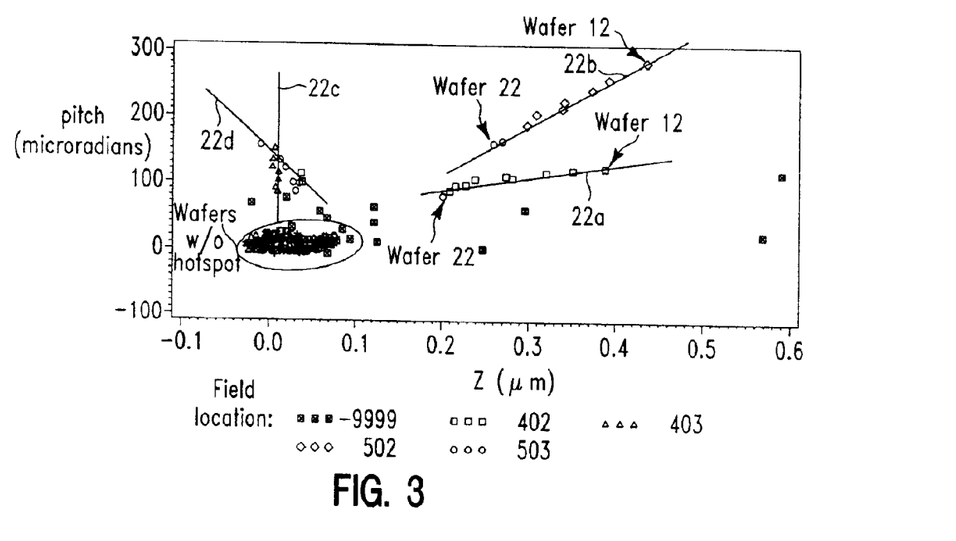
FIGS. 3 and 4 are scatter plots of z and pitch data, respectively, for a group of substrates having localized elevations caused by foreign particulate matter on the chuck.

For the hotspot 14 located as shown in FIG. 2 and caused by foreign particulate matter 12 on chuck 10, a scatter plot of the maximum z delta (Z) and maximum pitch delta (pitch) for a group of wafers (i.e. a multi-wafer lot) having hotspots 14 is shown in FIG. 3. Each data point represents a specific field corresponding to a specific wafer in this multi-wafer lot. Hotspots 14 are represented on this plot by the data points which form lines 22a, 22b, 22c and 22d corresponding to fields 402, 502, 403 and 503, respectively. For a given wafer, since a substantial portion of hotspot 14 is located within fields 402 and 502, the z and pitch for both of these fields have relatively high values as represented by lines 22a and 22b. Fields 403 and 503 are affected by a relatively smaller portion of hotspot 14 resulting in low z values and high pitch values as represented by lines 22c and 22d. In other words, the height of hotspot 14 in fields 403 and 503 is relatively low, however, there is enough of a change in topography to affect the delta value for pitch (and roll). The cluster of data points near the origin (0, 0) indicate that no hotspots are present in these fields.

Lines 22a–d occur when hotspots 14 are caused by foreign particulate matter 12 attached to surface 8 of chuck 10. Foreign particulate matter 12 attached to surface 8 of chuck 10 will cause a localized elevation, i.e. a bump, on upper surface 4 of wafer 2, and hence hotspot 14, in the same field location on several wafers. An assumption is made that while the topography for each wafer in a given wafer lot is the same, the overall height (maximum z delta) of the bump may be different on each wafer. The height of the bump can be expressed as follows:

$$Z(j,x,y)=a(j)*b(x,y) \qquad \text{Equation 1:}$$

where $Z(j,x,y)$ is the height (maximum z delta) of the bump of the jth wafer at location (x,y). The shape of the bump is described by the function $b(x,y)$ (having a maximum height of 1) and the maximum height of the bump on wafer j is described by the function $a(j)$.

The pitch and roll as functions of position and wafer number are then expressed as:

$$\text{pitch}(j,x,y)=a(j)*[db(x,y)/dy] \qquad \text{Equation 2:}$$

$$\text{roll}(j,x,y)=a(j)*[db(x,y)/dx] \qquad \text{Equation 3:}$$

For the case when the maximum z delta in a field occurs at (xo,yo), the maximum pitch delta occurs at (x1,y1) and the maximum roll delta occurs at (x2,y2) (note that these 3 positions in general will not be the same), and that values received for z, pitch and roll are the maximum delta values for z, pitch and roll encountered in the field, then three independent ratios of the maximum z, pitch and roll deltas can be obtained as follows:

For the case when the maximum z delta in a field occurs at (xo,yo), the maximum pitch delta occurs at (x1,y1) and the maximum roll delta occurs at (x2,y2) (note that these 3 positions in general will not be the same), and that values received for z, pitch and roll are the maximum delta values for z, pitch and roll encountered in the field, then three independent ratios of the maximum z, pitch and roll deltas can be obtained as follows:

$$pz(j):=\text{pitchmax}(j)/\text{zmax}(j)=[db(x1,y1)/dy]/b(xo,yo) \qquad \text{Equation 4:}$$

$$rz(j):=\text{rollmax}(j)/\text{zmax}(j)=[db(x2,y2)/dx]/b(xo,yo) \qquad \text{Equation 5:}$$

$$rp(j):=\text{pitchmax}(j)/\text{rollmax}(j)=[db(x2,y2)/dx]/[db(x1,y1)/dy] \qquad \text{Equation 6:}$$

Each of the Equations 4–6 are independent of $a(j)$ and as such are independent of the wafer. Equations 4–6 depend only on the function $b(x,y)$, which describes the shape of the hotspot in the field. This explains the linear relationships (i.e. lines 22a–d) found in FIG. 3. Lines 22a–d will have different slopes due to the location of the hotspot 14 in the respective fields 402, 403, 502 and 503 (as shown in FIG. 2). Likewise, the positions in the respective fields where z, pitch and roll are maximum are also different due to the location of the hotspot 14.

Figure 4:
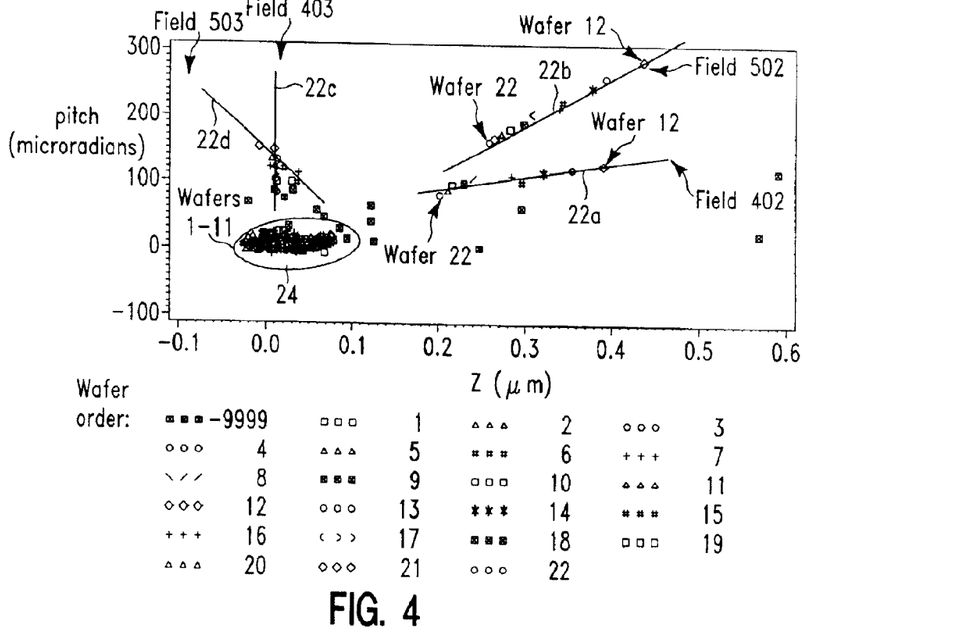

FIG. 4 is a scatter plot of the same data as shown in FIG. 3 except that the wafer process order (i.e. "wafer order") is indicated on each of the affected fields. It is shown in FIG. 4 that the data for wafers 1 through 11 is clustered in region 24 indicating the lack of a hotspot on any of wafers 1 through 11 while a hotspot started on wafer 12 (i.e. diamond shapes) and continued until the last wafer 22 (i.e. circle shapes). As was described with reference to FIGS. 2 and 3, the hotspot 14 affected fields 402, 403, 502 and 503 on each of wafers 12 through 22. Referring to lines 22a and 22b, it can be seen that the overall affect of the hotspot 14 diminished from wafer 12 to wafer 22, that is, both z and pitch are decreasing in value for each successive wafer (so $a(j)$ is a decreasing function of j) and the foreign particulate matter was still present after the processing of the last wafer 22 was completed. Based on this information, if the chuck is not cleaned, wafers from a subsequent wafer lot with the same field layout to be processed would have a hotspot affecting the same fields (i.e. fields 402, 403, 502, 503) on the subsequent wafers since the foreign particulate matter would still be present in the same location on the chuck. It should be noted that wafers from a subsequent wafer lot that has a different field layout would have a hotspot in the same physical location on the subsequent wafers, however different fields (i.e. different field coordinates) would be affected.

Figure 5A:
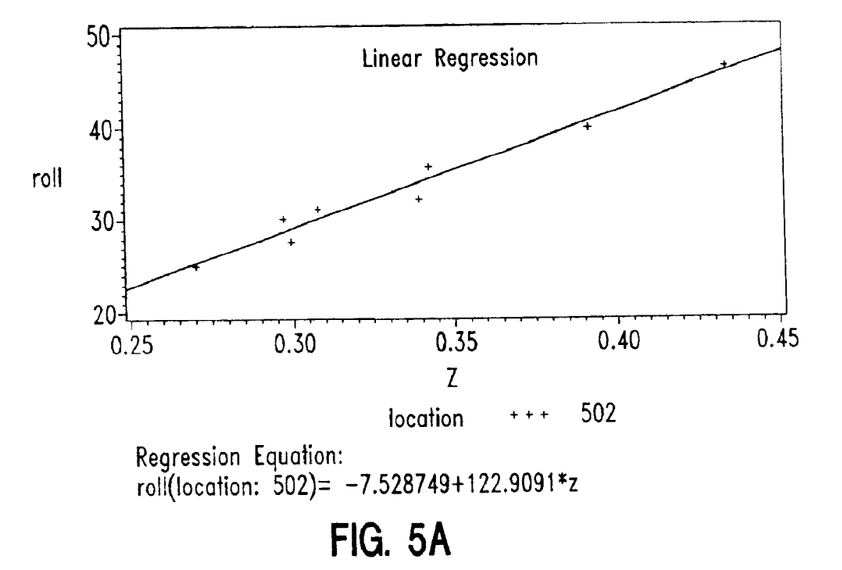
FIGS. 5A–C are best linear regression fit lines for data shown in FIGS. 3 and 4 according to the present invention.
Figure 5B:
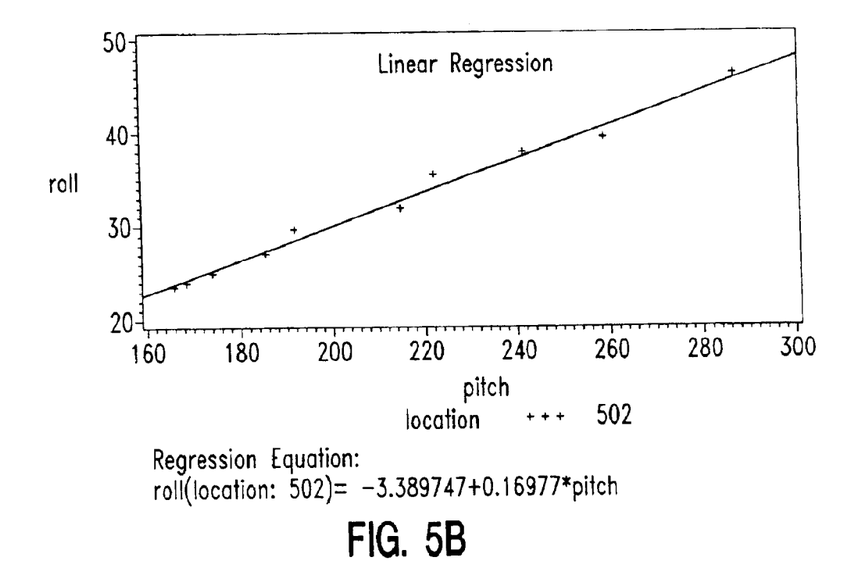
Figure 5C:
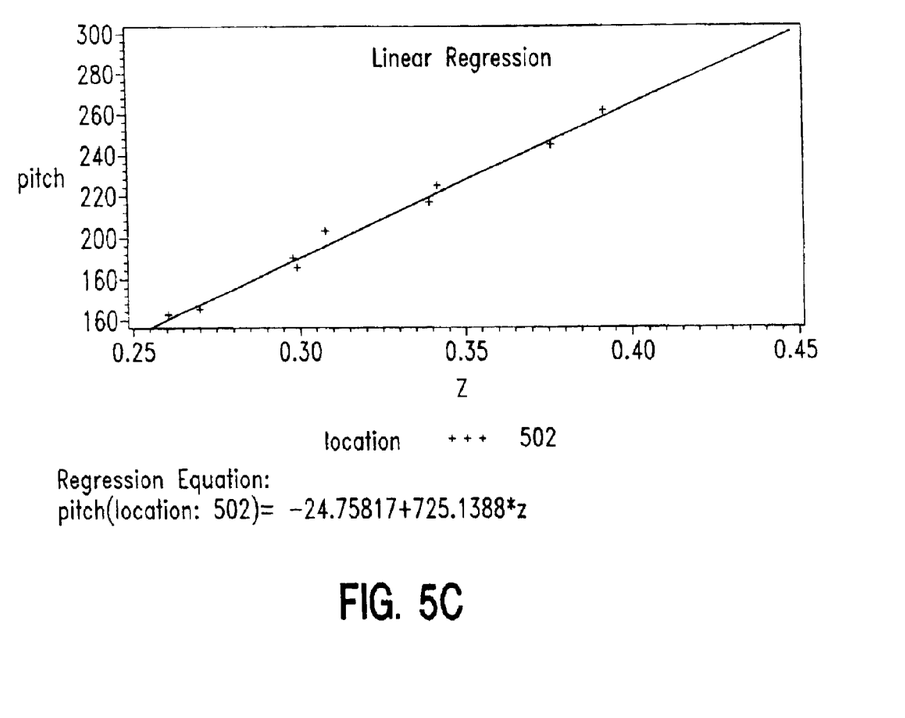

One further relationship can be deduced from this physical model. For example, the delta z, pitch and roll values corresponding to the data points which form line 22b (field 502) can be plotted two variables at a time (i.e. roll vs z, roll vs pitch, and pitch vs z) as shown in the scatter plots in FIGS. 5A–C. FIGS. 5A–C show that a scatter plot of any two of the z, pitch and roll variables will yield a linear relationship for the field having a hotspot and are actually lines in 3-dimensional z, pitch and roll space. Linear regression of the data values results in slopes of the three fitted lines that are related in the following manner:

$$pz*rp=rz,\qquad\text{Equation 7:}$$

where pz represents the slope of the "pitch vs z" fitted line (FIG. 5C), rp represents the slope of the "roll vs pitch" fitted line (FIG. 5B), and rz represents the slope of the "roll vs z" fitted line (FIG. 5A).

Equation 7 is derived from Equations 1–6 given above. The pitch-z (FIG. 5C) and roll-pitch (FIG. 5B) best linear regression fit lines yield slopes pz=725.1 and rp=0.170, respectively. The product of pz*rp is 123.2, which is very close to the best fit value of 122.9 found on the z-roll plot (FIG. 5A). It should be noted that this relationship is a statistical one and the relationship should hold within fit errors. The slope of each fit obeys a "t distribution" with n−2 degrees of freedom (n=number of wafers in the fit) as described in "Probability and Statistics for Engineers" by I. Miller and J. Freund, Prentice-Hall Inc. (1965), Theorem 12.1, p. 233, herein incorporated entirely by reference. Therefore, one can compute confidence limits and perform error propagation to test this formula. A further test is that each line should go through the origin, which can also be checked statistically in the same way.

The position of the hotspot in the field can also be determined from the slopes of the roll vs z (FIG. 5A) and the pitch vs z (FIG. 5C) scatter plots. A hotspot having a peak height in a field will have slopes for roll vs z and pitch vs z near a value of 0. Assuming that the peak of the hotspot has a flat portion, the pitch and roll angles decrease to about 0 as the peak is encountered resulting in the slopes for roll vs z and pitch vs z near 0.

During the photolithographic processing of semiconductor wafers, the present invention can be used to detect hotspots and determine the location of the source of the hotspots as follows. For the data values plotted in FIG. 3, user defined limits can be assigned to z and pitch such as, for example, z=0.15 um and pitch=80 microradians. Wafers are first identified for having hotspots by comparing the z, pitch and roll values of the wafers to the user defined limits. Delta values of z, pitch or roll which exceed the user defined limits (i.e. z greater than 0.15 um, or pitch greater than 80 microradians) indicate the presence of a hotspot. Referring to FIG. 3, the data values which form lines 22a–d, respectively, exceed the above described user defined limits for z and pitch (lines 22a, 22b) or for pitch only (lines 22c, d). Therefore, wafers 12 through 22 from which the data values for lines 22a–d is obtained, would each be identified as having a hotspot affecting fields 402, 403, 502 and 503 on each wafer.

When at least three wafers have been processed and at least three wafers are identified as having a hotspot, the analysis that was described with reference to FIGS. 5A–C is started by performing a linear fit for each field on all combinations of z, pitch and roll taken two at a time. From the linear fit lines for roll vs z, roll vs pitch, and pitch vs z, $R^2$ (see "Statistics", 3 edition, by J. McClare and F. Dietrich, Dellen Publishing Co. (1985), Definition 12.3, p. 609, herein incorporated entirely by reference) is extracted and any field having $R^2$ above a pre-assigned value such as, for example, 0.95, will most likely be caused by foreign particulate matter attached to the chuck. The reason one uses all three combinations of z, pitch and roll taken two at a time is that depending on how the hotspot is situated in the field, one of the three scatter plots will typically have less "noise" regarding linearity than the other two scatter plots. At least three wafers with hotspots are required to perform this calculation since linear fits are being computed, and the more wafers that are included in the linear regression calculation, the more certain that the linear fit is flagging a true chuck-related hotspot. This runs counter to the desire to catch the hotspot as soon as possible to avoid reworking of wafers. The number of wafers needed to gain confidence that the linear fit is flagging a true chuck-related hotspot can be minimized by performing statistical analysis on the computed slopes for all the fields identified as having a hotspot to see how well the pz*rp=rz relation holds. These calculations are relatively quick and can be implemented in real time if the photolithography tool can deliver the data in real time.

If the relationship between the slopes pz, rp and rz do not hold at some pre-assigned confidence level (i.e. $R^2$ less than 0.95), one can conclude that the hotspot is not chuck-related. In this case, the data will still give information regarding the source of the hotspot such as, for example, wafer backside damage (i.e. scratches) due to handling problems or random wafer backside foreign particulate matter. Wafer backside damage on multiple wafers can result in repeating hotspots in the same location from wafer to wafer, but without the reduction in amplitude that is seen with chuck-related hotspots caused by particulate matter attached to the upper surface of the chuck. Wafer backside foreign particulate matter that occurs at random locations from wafer to wafer will cause hotspots that are not repeating in the same location from one wafer to the next.

The present invention provides useful information which can be used during the processing of semiconductor substrates or wafers. For example, when analysis of focus parameter data determines that a wafer has a hotspot, the wafer can be diverted to a holding box for rework and reimaging rather than potentially forming a poor pattern on the hotspot resulting in a defective device. Likewise, the present invention provides information to identify which wafer or lot started a hotspot event. When data is analyzed in real time, an alarm can be issued to a tool operator when a hotspot is detected and, optionally, product flow within or into the tool can be prevented until corrective action is taken to eliminate the hotspot. When the source of the hotspot is determined to be related to the chuck, the present invention can provide the X/Y coordinates of the hotspot so that corrective maintenance on the chuck can be directed to the corresponding location on the chuck. In addition, the X/Y coordinates can be crosscoupled with a step array map to determine which chips are affected by the hotspot on a wafer and further correlate the affected chips (i.e. location of the hotspot) to a known yield distribution by wafer region. Limits can be set for the maximum number of hotspots that are detected so that appropriate corrective actions are taken.

Corrective action to eliminate the source of the hotspot can more appropriately be directed to the chuck (i.e. stop production, clean chuck to remove particulate matter, resume production) or wafers (i.e. stop production, remove wafers from the tool to determine source of particulate matter, start production with a new lot of wafers).

An advantage of the present invention is that the present invention is independent of imaging level or underlying optical qualities since it relies only on focus parameter data from the photolithographic tool to perform analysis on. Another advantage of the present invention is that no additional process or measurement step is necessary to detect the imaging defect since analysis is performed on the focus parameter data that is already generated by the photolithographic tool during the imaging step, thus saving cost and cycle time. Yet another advantage of the present invention is that all wafers that are processed through a photolithographic tool can be analyzed to detect for hotspots rather than only a sampling of wafers as is done with visual scanning or automated equipment inspection techniques which may result in wafers with imaging defects that could escape the defect inspection and result in yield loss. Still another advantage of the present invention is that the mean time to detect the source of the hotspot defect can be reduced from hours or days to minutes.

As a practical matter, the present invention is embodied in computer program code stored on a computer readable storage medium such as a tape, ROM, floppy disk, compact disc, and the like. The Nikon 203B tool has a display, a processor, RAM, and input/output devices such that the medium can be read and the tool controlled as by the program code of the invention to carry out the operations described above. Alternatively, the invention could be run on a separate computer that has control inputs to the processing tool in question. The invention has been embodied in a program written in the SAS computer programming language however those skilled in the art will realize that any computer programming language that can perform statistical calculations can be used to carry out the invention.

While the invention has been described above with reference to the preferred embodiments thereof, it is to be understood that the spirit and scope of the invention is not limited thereby. Rather, various modifications may be made to the invention without departing from the overall scope of the invention as described above and as set forth in the several claims appended hereto.

What is claimed is:

1. A method of locating a source of a localized elevation on a substrate, comprising the steps of:
   (a) measuring a first surface of a plurality of substrates placed separately on a chuck to obtain topography measurements including height (z), pitch and roll measurements;
   (b) comparing said z, pitch and roll measurements to pre-defined limits, wherein the presence of a localized elevation in a field on the first surface of the substrates is detected when any one of said z, pitch and roll measurements exceeds said pre-defined limit; and
   (c) determining whether the source results from the chuck.

2. The method of claim 1, wherein said pre-defined limits comprise z equal to about 0.15 um and pitch equal to about 80 microradians.

3. The method of claim 1, wherein the step (b) comprises detecting the presence of the localized elevation on at least three substrates.

4. The method of claim 3, wherein the step (c) comprises: calculating a best linear regression fit line for each pair of pitch-z, roll-pitch and z-roll measurements in the field; calculating $R^2$ for each of the calculated best linear regression fit lines; and comparing $R^2$ to a threshold value.

5. The method of claim 4, wherein the threshold value is 0.95.

6. The method of claim 4, wherein when $R^2$ is greater than the threshold value, the source of the localized elevation is related to the chuck.

7. The method of claim 6, wherein the source of the localized elevation comprises a foreign material particulate attached to the chuck.

8. The method of claim 7 further comprising the step of cleaning the chuck.

9. The method of claim 4, wherein when $R^2$ is less than the threshold value, the source of the localized elevation is related to at least one of said substrates.

10. The method of claim 9, wherein the source of the localized elevation comprises damage on a second surface of said at least one of said substrates.

11. The method of claim 10, wherein the damage comprises a scratch.

12. The method of claim 9, wherein the source of the localized elevation comprises a foreign material particulate attached to the second surface of said at least one of said substrates.

13. The method of claim 12 further comprising the step of cleaning said at least one of said substrates.

14. The method of claim 1, wherein when the presence of the localized elevation is detected, issuing an alarm.

15. The method of claim 14, wherein when substrates are being processed in a tool, preventing processing of subsequent substrates until corrective action is taken to eliminate the source of the localized elevation.

16. The method of claim 1, wherein when the source of the localized elevation is related to the chuck, providing the X/Y coordinates of the source of the localized elevation so that corrective action on the chuck can be directed to a corresponding location on the chuck.

17. The method of claim 1, wherein X/Y coordinates of the source of the localized elevation are correlated to a step array map to determine which chips are affected by the localized elevation.

18. The method of claim 17, wherein the affected chips are further correlated to a known yield distribution by substrate region.

19. The method of claim 1 further comprising setting a limit for a maximum number of localized elevations that are detected so that a corrective action can be taken to eliminate the source of the localized elevation.

20. The method of claim 19, wherein the corrective action comprises the steps of stopping processing, cleaning the chuck to remove particulate matter and resuming processing; or stopping production, removing wafers from the tool to determine the source of the localized elevation and starting production with a new lot of wafers.

21. The method of claim 1 further comprising the step of patterning an image on said first surface using a photolithographic tool.

22. The method of claim 21, wherein the topography measurements are obtained from focus parameter data from the photolithographic tool.

23. The method of claim 21, wherein locating the source of the localized elevation is independent of imaging level or underlying optical qualities.

24. The method claim 21, wherein each substrate is analyzed to detect the presence of a localized elevation.

25. A computer-readable program product for causing a computer to detect and characterize a defect on a surface of a first wafer, comprising:

a first program code means embodied in a computer useable medium for causing the computer to carry out a first set of measurements on a given surface of said first wafer placed on a chuck prior to carrying out an operation on said given surface;

a second program code means embodied in a computer useable medium for causing the computer to carry out a second set of measurements on said given surface of said first wafer while carrying out said operation on said given surface;

a third program code means embodied in a computer useable medium for causing the computer to determine a difference between said first set of measurements and said second set of measurements;

a fourth program code means embodied in a computer useable medium for causing the computer to carry out said first set of measurements, said second set of measurements and said difference measurement on a second wafer placed on the chuck;

a fifth program code means embodied in a computer useable medium for causing the computer to carry out said first set of measurements, said second set of measurements and said difference measurement on a third wafer placed on the chuck; and a sixth program code means embodied in a computer useable medium for causing the computer to compare said measurements from said first wafer, said second wafer, and said third wafer to determine whether a defect results from said chuck.

26. A program storage device readable by a machine, tangibly embodying a program of instructions executable by a machine to perform a method of locating a source of a localized elevation on a substrate, comprising the steps of:

(a) measuring a first surface of a plurality of substrates placed separately on a chuck to obtain topography measurements including height (z), pitch and roll measurements;

(b) comparing said z, pitch and roll measurements to pre-defined limits, wherein the presence of a localized elevation in a field on the first surface of the substrates is detected when any one of said z, pitch and roll measurements exceeds said pre-defined limit; and (c) determining whether the source results from the chuck.

27. The method of claim 26, wherein the step (b) comprises detecting the presence of the localized elevation on at least three substrates.

28. The method of claim 27, wherein the step (c) comprises:

calculating a best linear regression fit line for each pair of pitch-z, roll-pitch and z-roll measurements in the field;

calculating $R^2$ for each of the calculated best linear regression fit lines; and comparing $R^2$ to a threshold value.

29. The method of claim 28, wherein when $R^2$ is greater than the threshold value, the source of the localized elevation is related to the chuck.

30. The method of claim 28, wherein when $R^2$ is less than the threshold value, the source of the localized elevation is unique to said at least one of said plurality of the substrates.

* * * * *